US008726140B2

(12) United States Patent
Chang et al.

(10) Patent No.: US 8,726,140 B2
(45) Date of Patent: May 13, 2014

(54) DUMMY DATA PADDING AND ERROR CODE CORRECTING MEMORY CONTROLLER, DATA PROCESSING METHOD THEREOF, AND MEMORY SYSTEM INCLUDING THE SAME

(75) Inventors: Woo Tae Chang, Yongi-si (KR); Yong Tae Yim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 13/439,112

(22) Filed: Apr. 4, 2012

(65) Prior Publication Data

US 2012/0260149 A1   Oct. 11, 2012

(30) Foreign Application Priority Data

Apr. 6, 2011   (KR) .......................... 10-2011-0031503

(51) Int. Cl.
*G06F 11/00* (2006.01)
*H03M 13/00* (2006.01)

(52) U.S. Cl.
USPC ....................................................... 714/800

(58) Field of Classification Search
None
See application file for complete search history.

(56) References Cited

U.S. PATENT DOCUMENTS

| 6,684,289 | B1 | 1/2004 | Gonzalez et al. | |
|---|---|---|---|---|
| 7,574,554 | B2 | 8/2009 | Tanaka et al. | |
| 8,055,982 | B2 * | 11/2011 | Mulligan | 714/784 |
| 2004/0083334 | A1 * | 4/2004 | Chang et al. | 711/103 |
| 2006/0101193 | A1 * | 5/2006 | Murin | 711/103 |
| 2010/0082919 | A1 * | 4/2010 | Chen et al. | 711/161 |
| 2011/0060965 | A1 * | 3/2011 | Kwon et al. | 714/758 |
| 2011/0302477 | A1 * | 12/2011 | Goss et al. | 714/773 |
| 2012/0096328 | A1 * | 4/2012 | Franceschini et al. | 714/758 |
| 2012/0198129 | A1 * | 8/2012 | Van Aken et al. | 711/103 |

FOREIGN PATENT DOCUMENTS

| JP | 11-176083 A | 7/1999 |
|---|---|---|
| JP | 2004-164684 A | 6/2004 |
| JP | 2008-9635 A | 1/2008 |

* cited by examiner

*Primary Examiner* — Guerrier Merant
(74) *Attorney, Agent, or Firm* — Myers Bigel Sibley & Sajovec, P.A.

(57) ABSTRACT

A data processing method of a memory controller includes receiving first partial data of a last sector data among a plurality of sector data to be stored in an n-th page of a non-volatile memory in a program operation; padding the first partial data with first dummy data and generating a first error correction code (ECC) parity in the program operation; and transferring the first partial data and the first ECC parity to the non-volatile memory in the program operation, while refraining from transferring the first dummy data to the non-volatile memory. Related devices and systems are also described.

13 Claims, 13 Drawing Sheets

DUMMY DATA PADDING AND ERROR CODE CORRECTING MEMORY CONTROLLER, DATA PROCESSING METHOD THEREOF, AND MEMORY SYSTEM INCLUDING THE SAME

CROSS-REFERENCE TO RELATED APPLICATION

This application claims priority under 35 U.S.C. §119(a) from Korean Patent Application No. 10-2011-0031503 filed on Apr. 6, 2011, the disclosure of which is hereby incorporated by reference in its entirety.

BACKGROUND

Embodiments of the present inventive concepts relate to a data processing method for error correction, and more particularly, to a memory controller for controlling an operation of programming data having a smaller size than sector data to a flash memory, a data processing method thereof, and a memory system including the same.

With the development of technology and the decrease in price of a flash memory device, a solid state drive (SSD) including the flash memory device has been come to the fore as a storage medium that can be substituted for a hard disk drive (HDD).

The SSD generally inputs and outputs data at high speed, does not have data easily damaged by external shock compared to the HDD, generates less heat and less noise than the HDD, consumes less power than the HDD, and can be manufactured smaller and lighter than the HDD. Accordingly, the demand on the SSD is rapidly increasing with the trend of low power and large capacity.

As the SSD is also used as a mass storage medium, the size of a sector which is an input/output data unit is being flexibly changed.

SUMMARY

According to some embodiments of the present inventive concepts, there is provided a data processing method of a memory controller. The data processing method includes receiving first partial data of last sector data among a plurality of sector data to be stored in an n-th page in a program operation; padding the first partial data with first dummy data and generating a first error correction code (ECC) parity in the program operation; and transferring the first partial data and the first ECC parity to the non-volatile memory in the program operation, while refraining from transferring the first dummy data to the non-volatile memory.

A sum of a size of the first partial data and a size of the first dummy data may be equal to a size of sector data of the non-volatile memory. The first dummy data may be data with no errors.

The data processing method may further include storing size information of the first partial data and/or position information of the first partial data in a storage.

The data processing method may further include receiving the first partial data and the first ECC parity from the non-volatile memory in a read operation; padding the first partial data with the first dummy data and generating read data in the read operation; and performing error correction on the read data using the first ECC parity in the read operation.

The data processing method may further include receiving second partial data, which is stored in an (n+1)-th page of the non-volatile memory, of the last sector data in the program operation; padding the second partial data with second dummy data and generating a second ECC parity in the program operation; and transferring the second partial data and the second ECC parity to the non-volatile memory, while refraining from transferring the second dummy data to the non-volatile memory, in the program operation.

The receiving the second partial data may include receiving size information and/or position information of the first partial data, which are stored in a storage, together with the second partial data.

The data processing method may further include receiving the second partial data and the second ECC parity from the non-volatile memory in a read operation; padding the second partial data with the second dummy data and generating read data in the read operation; and performing error correction on the read data using the second ECC parity in the read operation.

The data processing method may further include storing the first partial data read in a read operation on the n-th page of the non-volatile memory in a buffer memory; reading the second partial data from the (n+1)-th page; and recovering the first partial data and the second partial data to the sector data and transferring the sector data to a host.

According to other embodiments of the present inventive concepts, there is provided a flash memory device which performs data input/output in units of sectors. The flash memory device include an n-th page which stores at least one partial data and at least one error correction code (ECC) parity for the at least one partial data, wherein the at least one partial data is smaller than each sector.

The page may be a basic unit of a program or read operation and may store a plurality of sector data.

According to further embodiments of the present inventive concepts, there is provided a memory controller including a buffer manager configured to manage data including first partial data of at least one sector data, an ECC engine configured to pad the first partial data with first dummy data and generate a first ECC parity, and a flash manager configured to be connected between the buffer manager and the ECC engine and to transmit the first partial data and the first parity to a flash memory, while refraining from transmitting the first dummy data to the flash memory, according to a command of a host.

The flash manager may include a storage configured to store size information of the first partial data and/or position information of the first partial data.

The ECC engine may calculate a size of the first dummy data using size information and/or the position information of the first partial data stored in the storage.

The buffer manager may control a buffer memory to temporarily store second partial data of the sector data while the first partial data is programmed to an n-th page of the flash memory.

The buffer manager may control the buffer memory to temporarily store the first partial data read from the n-th page of the flash memory while an (n+1)-th page of the flash memory including second partial data related with the first partial data is read.

When the flash manager reads the first partial data and the first parity from the flash memory according to a command of the host, the ECC engine may pad the first partial data with the first dummy data to generate read data and perform error correction on the read data using the first parity.

The ECC engine may include a data padding logic configured to pad the first partial data with the first dummy data, an encoder configured to generate the first ECC parity using the first partial data and the first dummy data, and a decoder configured to perform error correction on the first partial data using the first ECC parity.

According to yet other embodiments of the present inventive concepts, there is provided a memory system including a flash memory device and a memory controller configured to control the flash memory device. When receiving first partial data of last sector data among a plurality of sector data to be stored in an n-th page of the flash memory device, the memory controller may pad the first partial data with first dummy data, generate a first ECC parity, and transfer the first partial data and the first parity to the flash memory device, while refraining from transmitting the first dummy data to the flash memory device.

The memory system may further include a buffer memory configured to temporarily store second partial data of the last sector data while the first partial data is programmed to the flash memory device.

The memory system may further include a storage configured to store size information of the first partial data and/or position information of the first partial data.

When receiving the size information and/or the position information of the first partial data from the storage and receiving the second partial data from the buffer memory, the memory controller may pad the second partial data with second dummy data, generate a second ECC parity, and transfer the second partial data and the second parity to the flash memory device.

When receiving the first partial data and the first parity from the flash memory device, the memory controller may pad the first partial data with the first dummy data to generate read data and perform error correction on the read data using the first ECC parity.

BRIEF DESCRIPTION OF THE DRAWINGS

The above and other features and advantages of the present inventive concepts will become more apparent by describing in detail exemplary embodiments thereof with reference to the attached drawings in which.

DETAILED DESCRIPTION OF THE EMBODIMENTS

Figure 1:
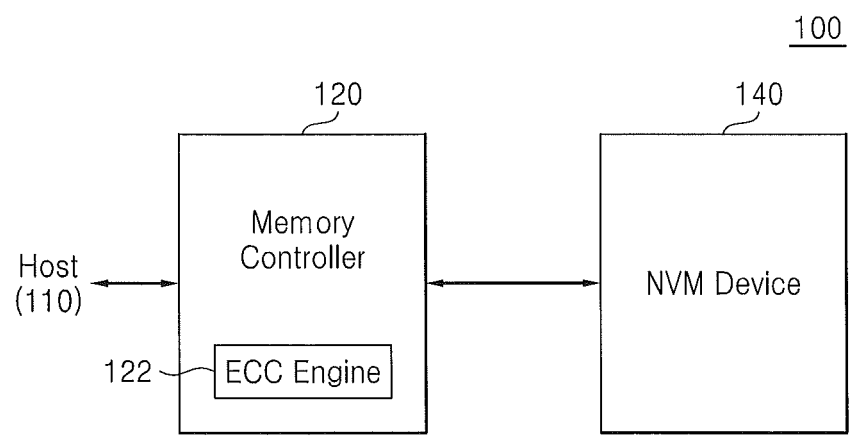
FIG. 1 is a block diagram of a memory system according to some embodiments of the inventive concepts.

The present inventive concepts now will be described more fully hereinafter with reference to the accompanying drawings, in which embodiments of the inventive concepts are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory system 100 according to some embodiments of the inventive concepts. The memory system 100 includes a memory controller 120 and a non-volatile memory (NVM) device 140. The NVM device 140 may be implemented by a flash memory device. The flash memory device includes a plurality of flash memory cells each of which may be implemented by a single level cell (SLC) that can store one bit or a multi level cell (MLC) that can store two or more bits. The memory controller 120 and the NVM device 140 may be packed in a single package, e.g., a single chip or multi chip package.

The memory system 100 may be implemented as a personal computer (PC), a laptop computer, a tablet PC, a digital camera, a cellular phone, a smart phone, an MP3 player, a portable multimedia player (PMP), a navigation system and/or a game machine and may communicate with a host 110 via wired and/or wireless connection.

In addition, the memory system 100 may also be implemented as a mobile storage system such as a universal serial bus memory (USB) memory or a memory card (e.g., a multimedia card (MMC), a secure digital (SD) card, a compact flash (CF) card, and/or a subscriber identification module (SIM) card.

The memory controller 120 is connected between the host 110 and the NVM device 140. In response to request from the host 110, the memory controller 120 may access the NVM device 140. For instance, the memory controller 120 may control an access operation, for example, a read operation, a program operation and/or an erase operation, to the NVM device 140.

The memory controller 120 includes an error correction code (ECC) engine 122 which generates a parity for each partial data. Accordingly, the memory controller 120 can perform error detection and/or error correction on read data.

Figure 2:
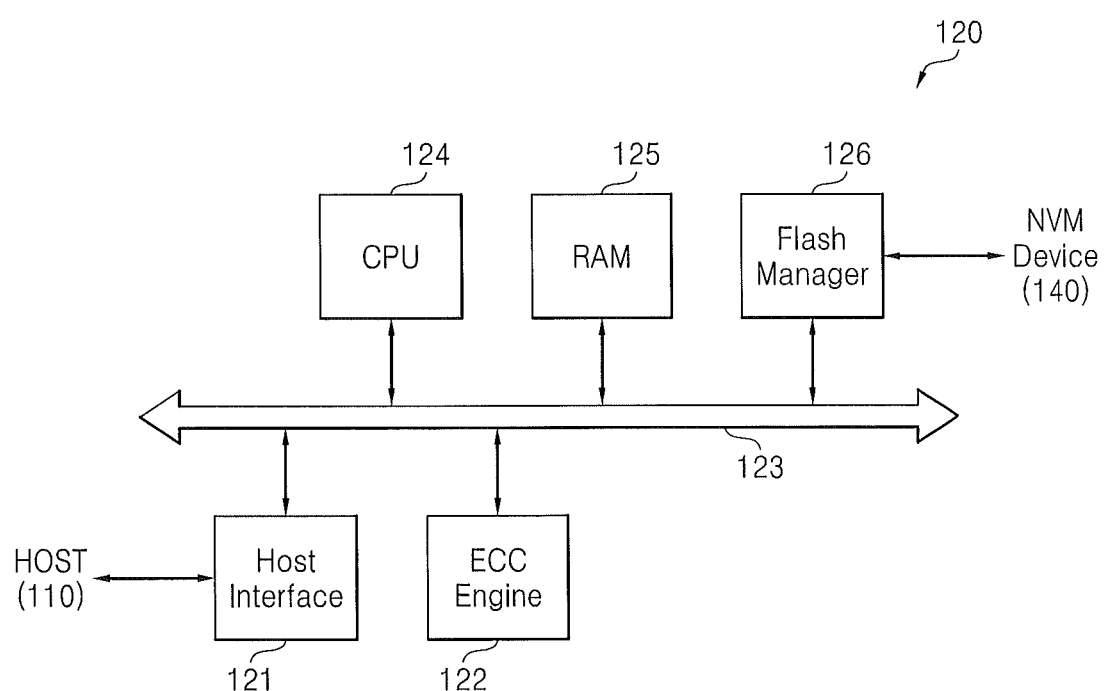
FIG. 2 is a block diagram of a memory controller illustrated in FIG. 1.

FIG. 2 is a block diagram of the memory controller 120 illustrated in FIG. 1. Referring to FIG. 2, the memory controller 120 includes a host interface 121, the ECC engine 122, a central processing unit (CPU) 124, a random access memory (RAM) 125, and a flash manager 126. The elements 121, 122, 124, 125 and 126 may perform data communication with one another via a data bus 123.

The host interface 121 may be implemented by a circuit, a logic, a code or a combination thereof and provides interface with the host 110. The NVM device 140 and the host 110 communicate with each other through the host interface 121 and the flash manager 126.

The CPU 124 controls the overall operation of the memory system 100 in response to the request of the host 110.

The RAM 125 may be implemented by a dynamic RAM (DRAM) and/or a static RAM (SRAM) and functions as a buffer memory and data information block. The RAM 125 temporarily stores data transmitted from the host 110 and/or data to be transmitted to the host 110.

The RAM 125 is also used to drive or execute firmware such as a flash translation layer (FTL). The FTL is executed by the CPU 124 to manage address mapping, wear-leveling of the NVM device 140, data preservation in case of unexpected power-off, and so on.

Meanwhile, the RAM 125 may store information (or table information) to manage error information. The information is metadata and is stored in a spare region of the NVM device 140 according to the control of the CPU 124. The information is copied or loaded from the spare region to the RAM 125 at power-up. The memory system 100 may also include a read-only memory (ROM) (not shown) storing code data for the interface with the host 110.

The flash manager 126 may be implemented by a circuit, a logic, a code or a combination thereof and controls an access to the NVM device 140 in response to the request of the CPU 124. Accordingly, the flash manager 126 may process a flash memory command, such as a page read command, a program command or an erase command, and/or data transmission.

Data or partial data is stored together with a value referred to as an "error correction code parity" or an "ECC parity" in the NVM device 140, for example, a flash memory device. The ECC parity is used to correct an error in data stored in the flash memory device. The number of errors that can be corrected using the ECC parity is limited. Any error correction coding technique may be used to generate the ECC parity.

The ECC engine 122 generates an ECC parity using data transmitted to the NVM device 140. The ECC engine 122 may be implemented inside or outside the memory controller 120 in the memory system 100 according to embodiments.

An error detection technique and an error correction technique provide efficient recovery of data damaged due to various causes. For instance, data may be damaged due to various causes while being stored in the NVM device 140 and also may be damaged due to the state of a data transmission channel through which the data is transmitted from a source to a destination, for example, channel perturbation.

Various approaches for detecting and correcting damaged data have been suggested. For instance, a Reed-Solomon (RS) code, a Hamming code, a Bose-Chaudhuri-Hocquenghem (BCH) code and/or a cyclic redundancy check (CRC) code may be used for error detection, to generate an ECC parity. Any error correction coding technique may be used to generate the ECC parity.

Figure 3:
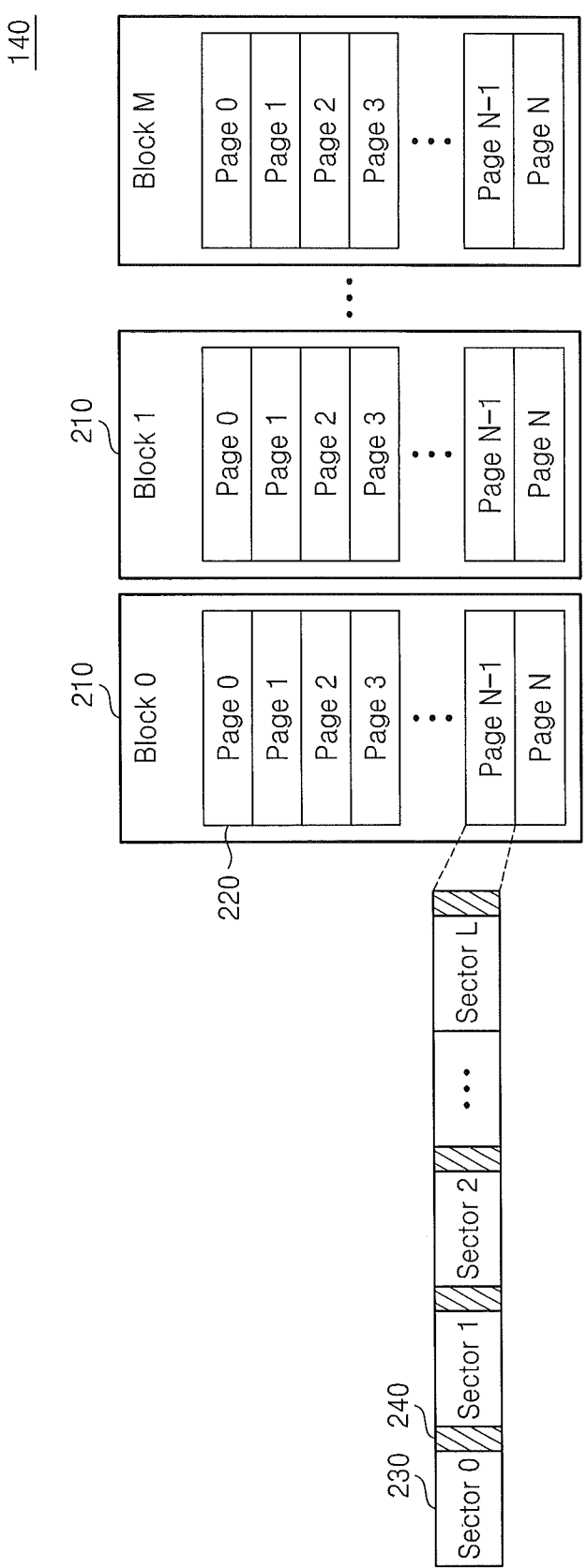
FIG. 3 is a block diagram of a non-volatile memory (NVM) device illustrated in FIG. 1.

FIG. 3 is a block diagram of the NVM device 140 illustrated in FIG. 1. The NVM device 140 illustrated in FIG. 3 may be implemented by a flash memory device. The flash memory device 140 may include a plurality of (e.g., 1024, 2048 or 8192) blocks 210. In the flash memory device 140, each block 210 is a basic unit of an erase operation. Each block 210 may include a plurality of (e.g., 16, 32, 64 or 128) pages 220. Each page 220 is a basic unit of a program operation or read operation.

Each page 220 includes a plurality of sectors 230. Each sector 230 is a basic unit of data input/output in the flash memory device 140. An error detection/correction code, i.e., an ECC parity 240 is generated based on data stored in each sector 230, i.e., sector data. The ECC parity 240 is generated for sector data to be stored in each sector 230. At this time, the size of the sector 230 that can guarantee error correction may change depending on the ECC engine 122.

Figure 4:
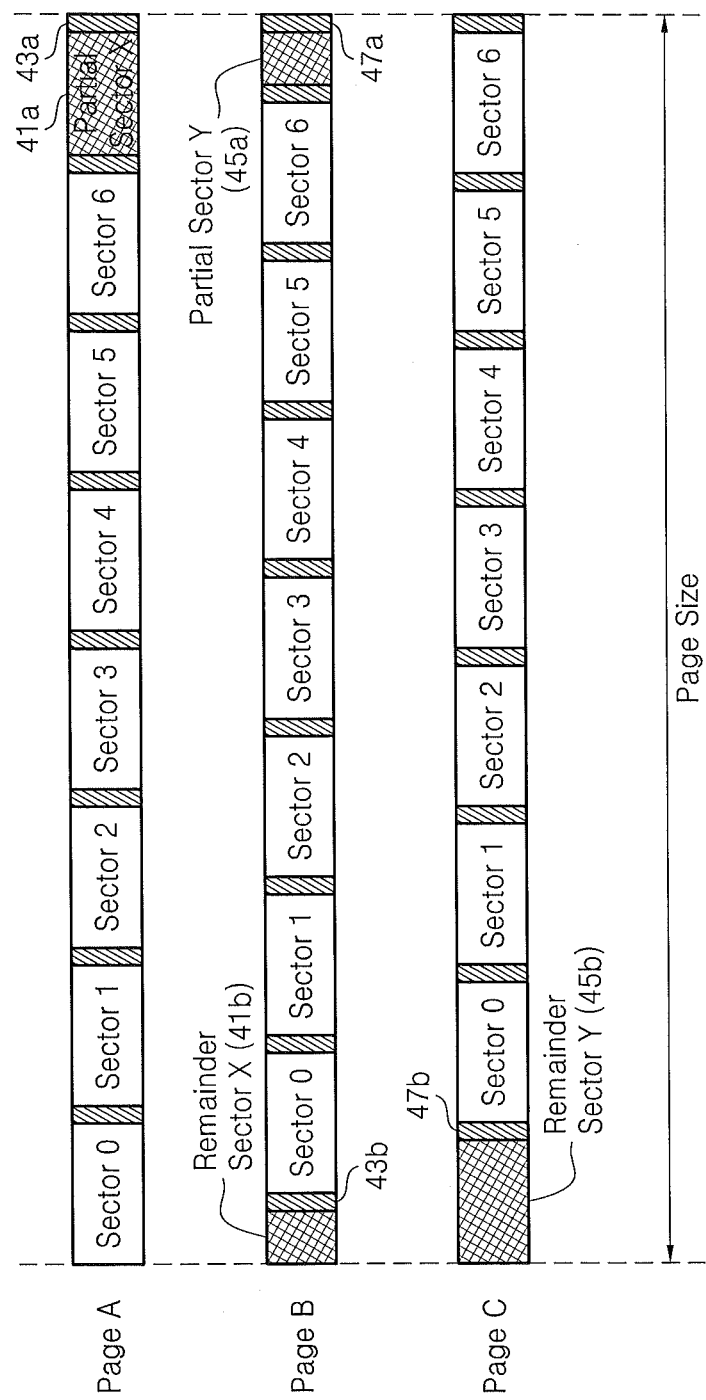
FIG. 4 is a diagram of a page map of a flash memory according to some embodiments of the inventive concepts.

FIG. 4 is a diagram of a page map of a flash memory according to some embodiments of the inventive concepts. The page map corresponds to a memory map of the flash memory device 140 illustrated in FIG. 3. The size of pages A, B and C implemented in the flash memory device 140 is fixed.

Accordingly, when sequential data, e.g., a plurality of sector data, is programmed to a particular page, the particular page may not have sufficient space for the last sector data among the plurality of sector data. At this time, only part of the last sector data is programmed to the particular page and the remainder of the last sector data may be programmed to another page adjacent to the particular page.

The size of the part, programmed to the particular page, of the last sector data is smaller than the size of normal sector data. Accordingly, the part of the last sector data may be referred to as data smaller than sector data or partial data.

In describing the embodiments of the present inventive concept, partial data, programmed to an n-th page (where "n" is a natural number), of the last sector data is defined as "first part" or "first partial data" and partial data, programmed to an (n+1)-th page, of the last sector data is defined as "second part" or "second partial data".

Referring to FIGS. 2 through 4, partial data 41a, 41b, 45a and 45b and ECC parities 43a, 43b, 47a and 47b are programmed to storage regions, i.e., Partial Sector X, Remainder Sector X, Partial Sector Y and Remainder Sector Y, respectively.

The memory controller 120 programs data up to the first partial data 41a of the last sector data and the first ECC parity 43a for the first partial data 41a to the page A. The memory controller 120 stores the second partial data 41b of the last sector data in the RAM 125. Thereafter, the memory controller 120 performs a program operation on the page B beginning with the second partial data 41b.

Figure 10:
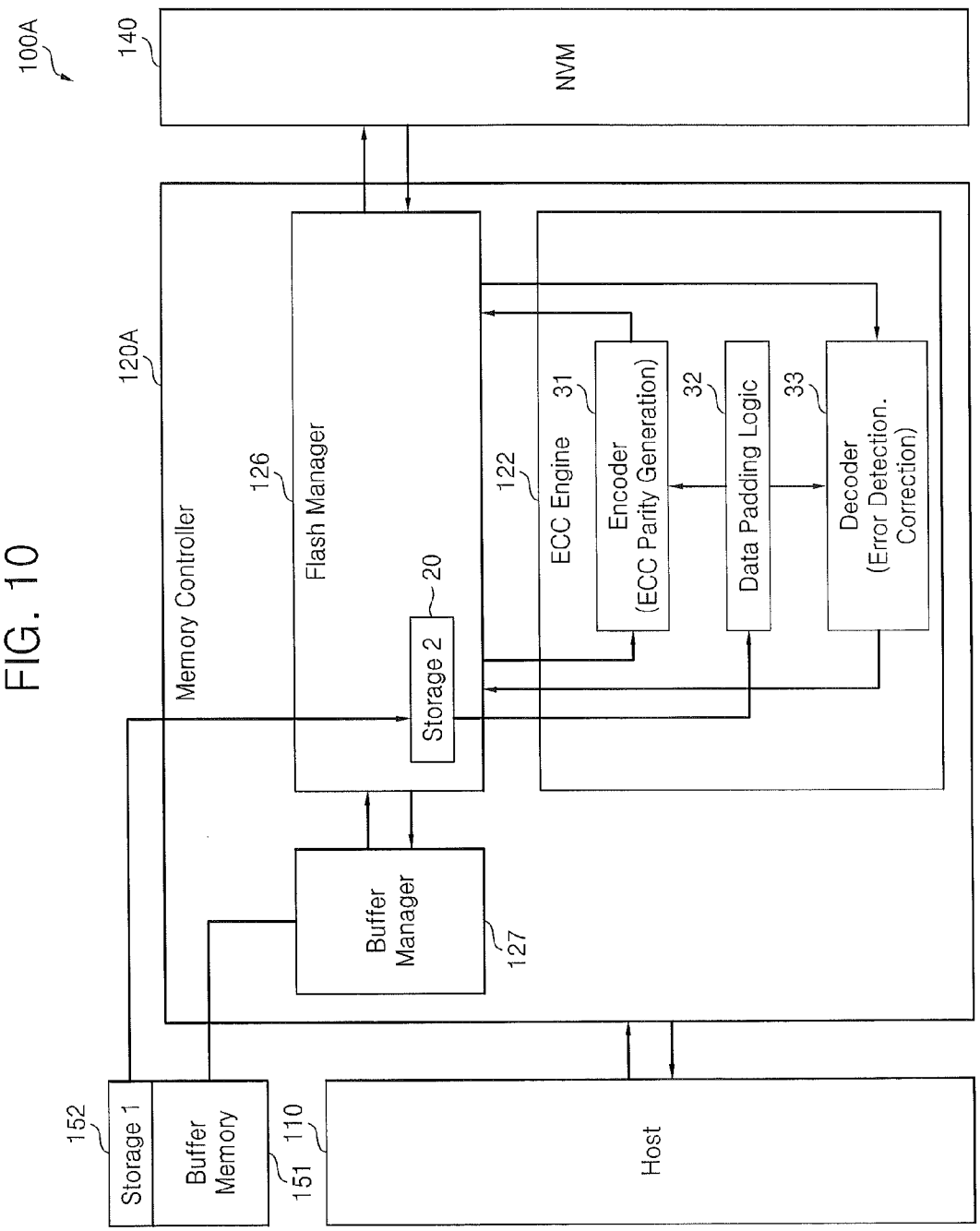
FIG. 10 is a block diagram of a memory system according to other embodiments of the inventive concepts.

Referring to FIG. 2 or 10, to transmit sector data including the first partial data 41a programmed to the page A and second partial data 41b programmed to the page B to the host 110, the memory controller 120 stores the first partial data 41a that has been error-corrected in a buffer memory 125 or 151 and then performs error correction on the second partial data 41b. The memory controller 120 transmits sector data including the first partial data 41a stored in the buffer memory 125 or 151 and the error-corrected second partial data 41b to the host 110.

Apart from the read operation, program operation and erase operation, the flash memory device 140 may also support a copy back program operation in which source page data stored in a source page is copied to a target page.

For instance, the page A to which the first partial data 41a is programmed and the page B to which the second partial data 41b is programmed may not be sequentially positioned. Accordingly, as shown in FIG. 10, a first storage 152 stores information about the second partial data 41b together with an address mapping table generated by the FTL in order to support the copy back program operation.

Figure 5:
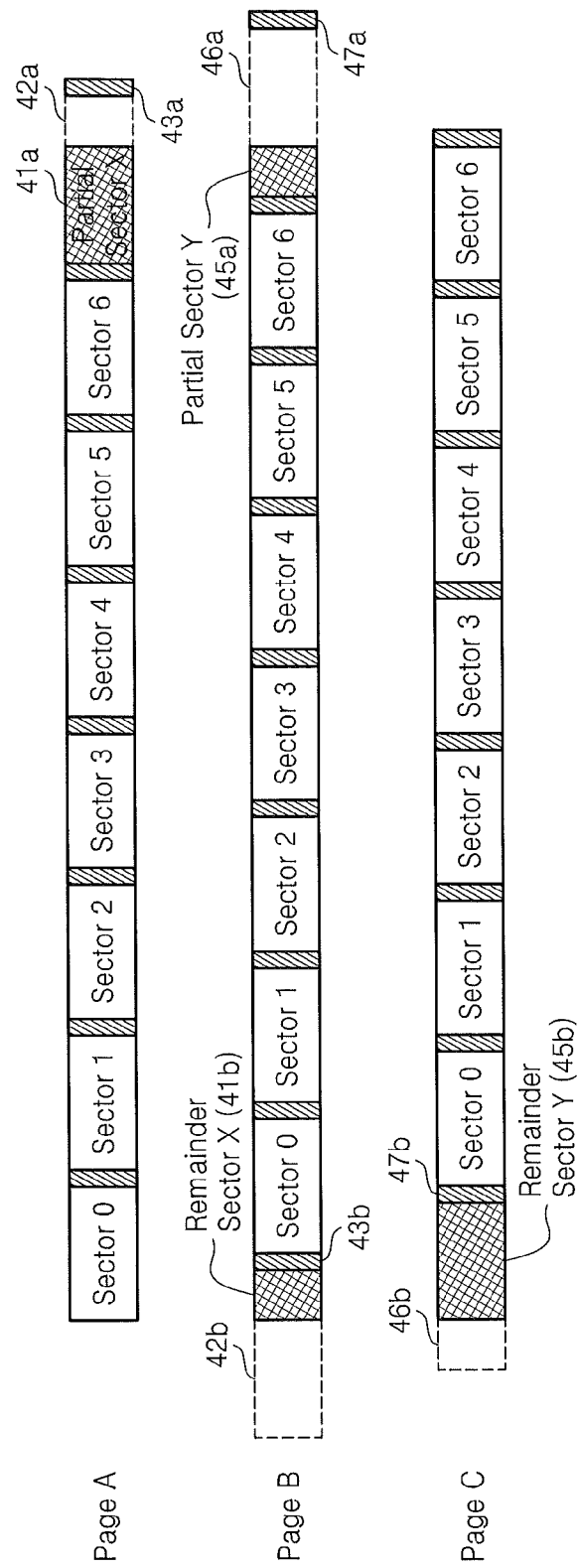
FIG. 5 is a conceptual diagram for explaining the operation of an error correction code (ECC) engine illustrated in FIG. 2.

FIG. 5 is a conceptual diagram for explaining the operation of the ECC engine 122 illustrated in FIG. 2. The ECC engine 122 performs an encoding operation and/or a decoding operation. It may generate an ECC parity per sector data only. Accordingly, the ECC engine 122 uses partial data and dummy data in order to generate an ECC parity per sector data.

Referring to FIGS. 2 and 5, the ECC engine 122 pads partial data 41a, 41b, 45a and 45b with dummy data 42a, 42b, 46a and 46b, respectively, so that it generates ECC parities 43a, 43b, 47a and 47b. According to embodiments, the dummy data 42b and 46b may be padded to the front or the rear of the second partial data 41b and 45b, respectively. Here, padding is an operation of adding (or appending) dummy data to partial data to generate data having the size of sector data.

For instance, the ECC engine 122 that may generate an ECC parity per sector data pads the first partial data 41a of the last sector in page data to be stored in page A with the first dummy data 42a, so that the first ECC parity 43a is generated for the first partial data 41a. In other words, the ECC engine 122 pads the first partial data 41a with the first dummy data 42a to generate data having the same size as sector data.

The ECC engine 122 transmits only the first partial data 41a and the first ECC parity 43a to the NVM device 140 without the first dummy data 42a. At this time, the first dummy data 42a may be data with no errors or data that does not change the results of an ECC parity generation on partial sector data.

In the same manner, the ECC engine 122 pads the second partial data 41b of sector data to be stored in page B with the second dummy data 42b and generates the second ECC parity 43b to create data having the same size as the sector data. In the same manner, the ECC engine 122 pads the first partial data 45a of last sector data to be stored in the page B with the third dummy data 46a and generates the third ECC parity 47a and then pads the second partial data 45b of the last sector data to be stored in page C with the fourth dummy data 46b and generates the fourth ECC parity 47b.

The ECC engine 122 transmits each partial data 45a or 45b and each ECC parity 47a or 47b to the NVM device 140. As shown in FIG. 4, the first partial data 41a and the first ECC parity 43a are programmed to the rear portion of the page A; the second partial data 41b and the second ECC parity 43b are programmed to the front portion of the page B; the first partial data 45a and the third ECC parity 47a are programmed to the rear portion of the page B; and the second partial data 45b and the fourth ECC parity 47b are programmed to the front portion of the page C.

Even though a single sector data is split into two partial data, which are respectively programmed to two different pages, the memory controller 120 may perform the encoding or decoding operation independently on each page using an ECC parity.

The ECC engine 122 may be implemented by a circuit, a logic, a code or a combination thereof. The ECC engine 122 may calculate a dummy data size DDS necessary for the encoding or decoding operation on the page B having a size PBS using Equations 1 through 3:

$$PBS = RSX + (NS*L) + PSY, \quad (1)$$

$$NS = PSX + RSX = PSY + RSY, \quad (2)$$

and $$DDS = NS - PSY, \quad (3)$$

where L is a natural number and denotes the number of sector data that can be programmed to the page B, RSX denotes the size of storage space in which the second partial data 41b can be stored, RSY denotes the size of storage space in which the second partial data 45b can be stored, NS denotes the size of normal sector data (e.g., Sector 0 through Sector 6 shown in FIG. 5), PSX denotes the size of storage space in which the first partial data 41a can be stored, and PSY denotes the size of storage space in which the first partial data 45a can be stored.

Figure 6:
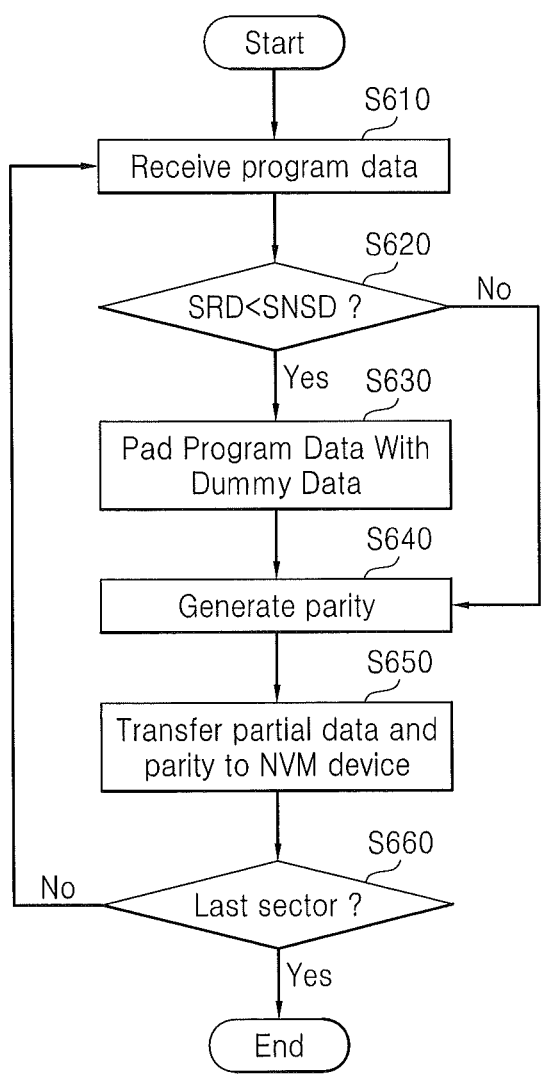
FIG. 6 is a flowchart of ECC encoding according to some embodiments of the inventive concepts.

FIG. 6 is a flowchart of ECC encoding according to some embodiments of the inventive concepts. FIG. 6 shows the operations of the ECC engine 122 illustrated in FIG. 2. Referring to FIGS. 1, 2 and 6, the memory system 100 receives from the host 110 data to be programmed to the NVM device 140 in operation S610.

The memory controller 120 determines whether the size of the received data (i.e., SRD) is smaller than the size of normal sector data (i.e., SNSD) in operation S620. When the size of the received data (SRD) is smaller than the size of normal sector data (SNSD), that is, when the received data is partial data, the ECC engine 122 pads the partial data with dummy data in order to generate an ECC parity in operation S630.

The ECC engine 122 generates the ECC parity for the partial data using the partial data and the dummy data in operation S640. The flash manager 126 transmits the partial data and the ECC parity from the ECC engine 122 to the NVM device 140 in operation S650.

However, when the size of the received data (SRD) is the same as the size of normal sector data (SNSD), the ECC engine 122 does not pad the received data with dummy data but immediately encodes the received data and generates an ECC parity in operation S640.

The ECC engine 122 repeats operations S610 through S660 until sector data, for example, program data, targeted to be encoded is the last sector data in a program operation in operation S660.

Figure 7:
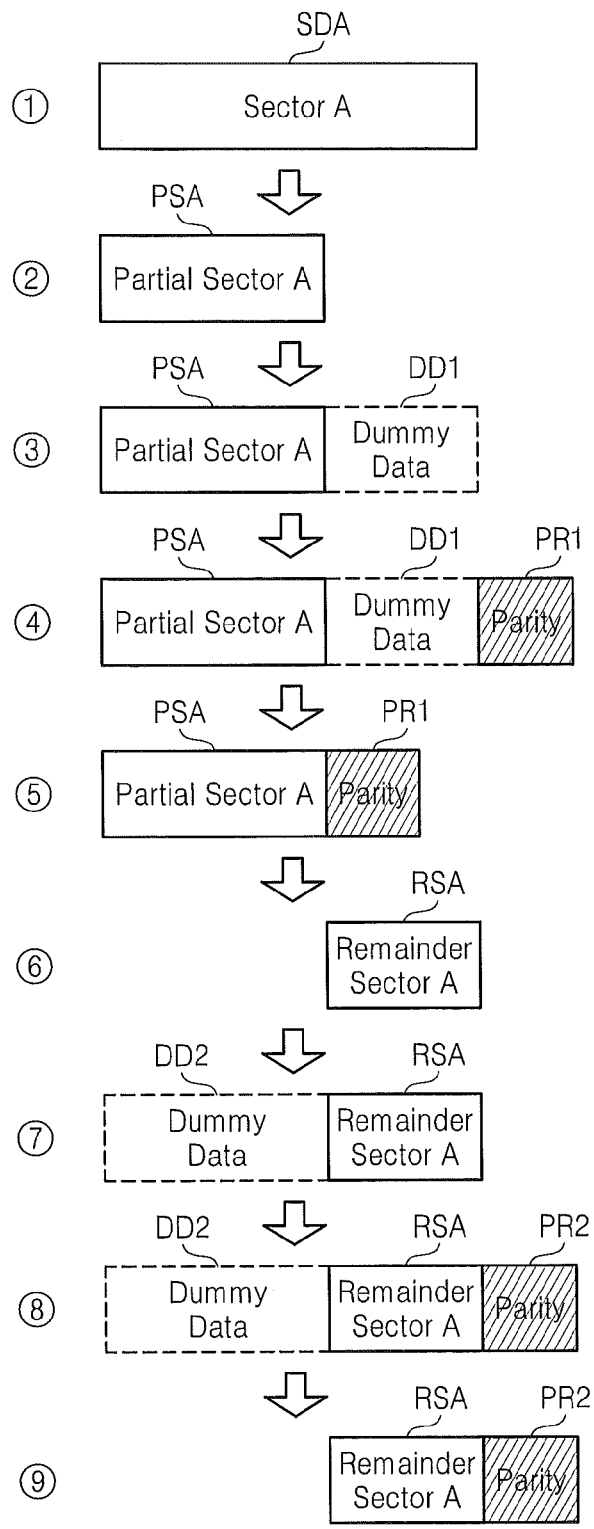
FIG. 7 is a diagram showing ECC encoding concept according to some embodiments of the inventive concepts.

FIG. 7 is a diagram showing ECC encoding concept according to some embodiments of the inventive concepts. FIG. 7 shows the operations of the ECC engine 122 illustrated in FIG. 2. Referring to FIGS. 2, 5 and 7, sector data A (SDA) is transferred from the host 110 to the memory controller 120

(①). At this time, the SDA is data including first partial data PSA and second partial data RSA and it is assumed that the first partial data PSA and the second partial data RSA are sequentially input to the memory controller 120 ((②) and (⑥))

It is assumed that a plurality of sector data, ECC parities for the respective sector data and lastly the first partial data PSA and a first ECC parity PR1 for the first partial data PSA are programmed to an n-th page. Since an ECC parity is generated for each sector data, the ECC engine 122 pads the first partial data PSA with first dummy data DD1 ((③)).

The ECC engine 122 performs encoding on the first partial data PSA and the first dummy data DD1, thereby generating the first ECC parity PR1 ((④)). The first ECC parity PR1 may be positioned at the rear of the first partial data PSA. The flash manager 126 programs to the n-th page of the NVM device 140 only the first partial data PSA and the first ECC parity PR1 without the first dummy data DD1 ((⑤)).

Thereafter, the ECC engine 122 receives the second partial data RSA to be programmed to an (n+1)-th page from a buffer memory ((②)), pads the second partial data RSA with second dummy data DD2 ((⑥)), encodes the second partial data RSA and the second dummy data DD2 to generate a second ECC parity PR2 ((⑦)), and programs the second partial data RSA and the second ECC parity PR2 to the (n+1)-th page of the NVM device 140 ((⑧)).

Figure 8:
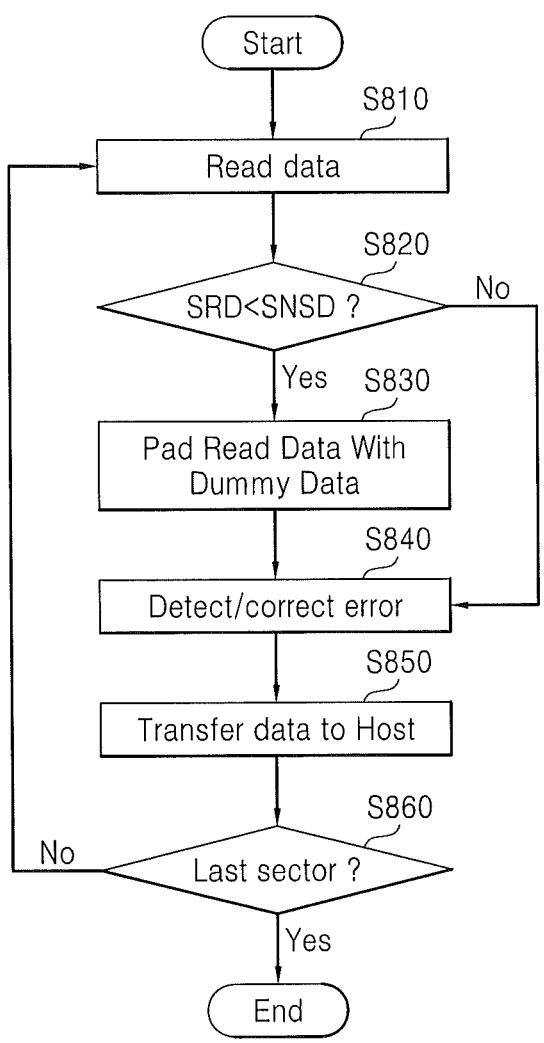
FIG. 8 is a flowchart of ECC decoding according to some embodiments of the inventive concepts.

FIG. 8 is a flowchart of ECC decoding according to some embodiments of the inventive concepts. Referring to FIGS. 1, 2, 5 and 8, the memory controller 120 reads data and an ECC parity from an n-th or (n+1)-th page of the NVM device 140 in response to a command received from the host 110 in operation S810.

The ECC engine 122 determines whether the size of the read data (i.e., SRD) is smaller than the size of normal sector data (i.e., SNSD) in operation S820. When the size of the read data (SRD) is smaller than the size of normal sector data (SNSD), that is, when the read data is partial data, e.g., first partial data or second partial data, the ECC engine 122 pads the first partial data with first dummy data or the second partial data with second dummy data in operation 5830.

The ECC engine 122 decodes sector data formed by padding the first partial data with the first dummy data using the first ECC parity, thereby detecting and correcting errors in the sector data in operation S840. The ECC engine 122 also decodes sector data formed by padding the second partial data with the second dummy data using the second ECC parity, thereby detecting and correcting errors in the sector data in operation S840.

The ECC engine 122 transfers the error-corrected first partial data and/or the error-corrected second partial data to the host 110 in operation S850. However, when the size of the read data (SRD) is the same as the size of normal sector data (SNSD), the ECC engine 122 decodes the read data using the ECC parity, thereby detecting and correcting errors in the read data in operation S840. The ECC engine 122 transfers the error-corrected sector data to the host 110 in operation S850.

The memory controller 120 terminates the decoding when the read data is the last sector data of the last page in the decoding operation in operation S860.

Figure 9:
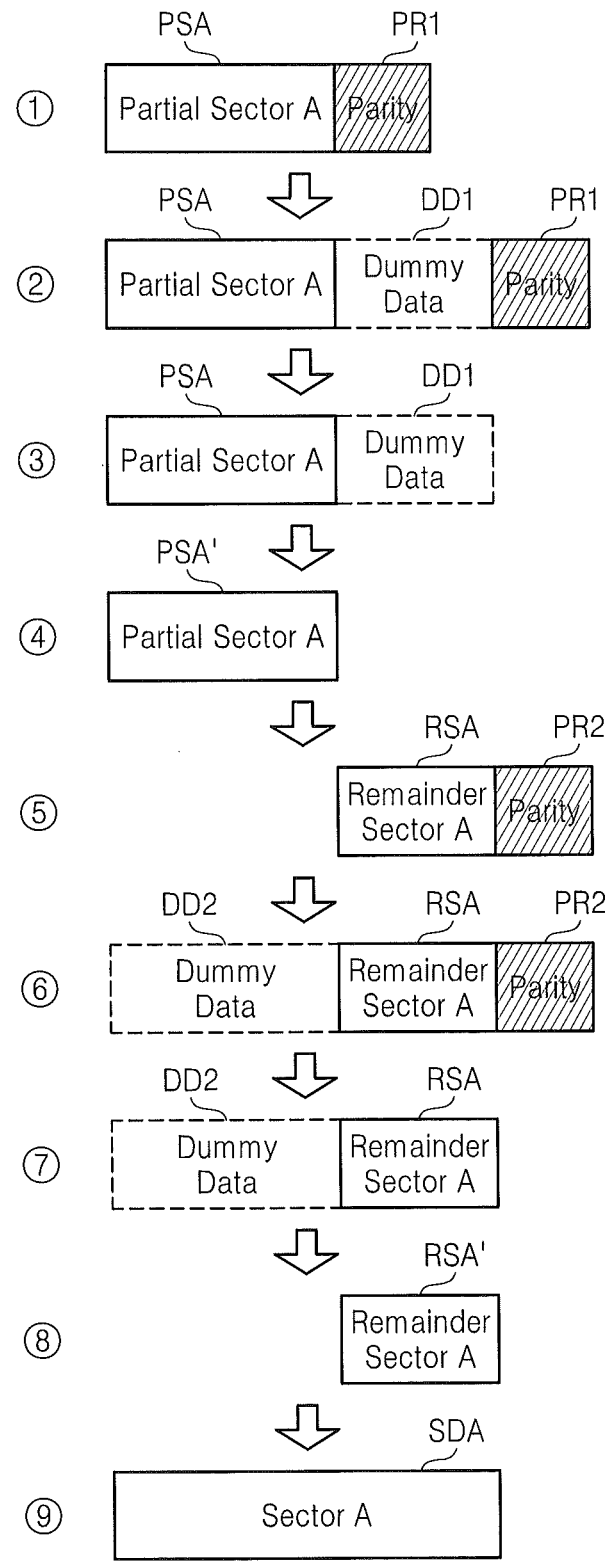
FIG. 9 is a diagram showing ECC decoding concept according to some embodiments of the inventive concepts.

FIG. 9 is a diagram showing ECC decoding concept according to some embodiments of the inventive concepts. Referring to FIGS. 2, 8 and 9, the memory controller 120 receives first partial data PSA and first ECC parity PR1 of sector data A (SDA) from an n-th page of the NVM device 140 ((①)).

The SDA is data that includes the first partial data PSA programmed to the n-th page and second partial data RSA programmed to an (n+1)-th page of the NVM device 140. It is assumed that the first partial data PSA and the second partial data RSA respectively stored in different pages are sequentially output from the NVM device 140 in a read operation.

The ECC engine 122 which has received the first partial data PSA and the first ECC parity PR1 output from the n-th page pads the first partial data PSA with first dummy data DD1 ((②)). The ECC engine 122 decodes sector data that includes the first partial data PSA and the first dummy data DD1 using the first ECC parity PR1 ((③)).

At this time, the ECC engine 122 performs error detection and error correction on the sector data, i.e., the first partial data PSA using the first ECC parity PR1 ((③)). The ECC engine 122 stores error-corrected first partial data PSA' in a buffer memory temporarily ((④)).

The ECC engine 122 receives the second partial data RSA and a second ECC parity PR2 from the (n+1)-th page and pads the second partial data RSA with second dummy data DD2 ((⑤) and (⑥)). The ECC engine 122 decodes sector data that includes the second partial data RSA and the second dummy data DD2 using the second ECC parity PR2. At this time, the ECC engine 122 performs error detection and error correction on the sector data, i.e., the second partial data RSA using the second ECC parity PR2 ((⑦)). The ECC engine 122 transfers the error-corrected second partial data RSA' to the buffer memory ((⑧)). The buffer memory transfers the SDA formed by combining the error-corrected first partial data PSA' and the error-corrected second partial data RSA' to the host 110 ((⑨)).

FIG. 10 is a block diagram of a memory system 100A according to other embodiments of the inventive concepts. Referring to FIG. 10, the memory system 100A includes a memory controller 120A, the NVM device 140, a buffer memory 151, and a first storage 152.

For clarity of the description, the host 110 is also illustrated in FIG. 10.

The memory controller 120A includes the ECC engine 122, the flash manager 126, and a buffer manager 127. The buffer memory 151 and the first storage 152 may be implemented by volatile memory such as DRAM or SRAM.

The buffer memory 151 temporarily stores data that has been transmitted from or will be transmitted to the host 110. When data is programmed to or read from the NVM device, e.g., a flash memory device, 140, the buffer memory 151 may temporarily stores first partial data and/or second partial data. For instance, when first partial data of the last sector data among data transmitted from the host 110 is programmed to the last sector of a particular page, the buffer memory 151 temporarily stores the first partial data of the last sector data.

When the size of data received from the host 110 is smaller than the size of normal sector data, the first storage 152 stores size information and/or position information of the received data. In particular, the first storage 152 stores size information and/or position information of second partial data which is related with a page to which first partial data is programmed. Thereafter, when the first partial data is programmed to or is read from the page, the first storage 152 sends the size information and/or position information of the second (or first) partial data to the memory controller 120A. The memory controller 120A stores the size information and/or the position information in a second storage 20 of the flash manager 126.

The buffer manager 127 manages input/output of data stored in the buffer memory 151. The buffer manager 127 may manage data input to and/or output from the NVM device 140 in units of bytes in order to manage data, e.g., first partial data and/or second partial data, smaller than normal sector data.

The flash manager 126 may receive data from the host 110 through the buffer manager 127 and program the data to the flash memory device 140. At this time, data to be programmed to the flash memory device 140 is input to the ECC engine 122 to be encoded. The flash manager 126 also receives the size information and/or the position information of the second (or first) partial data from the first storage 152. The memory controller 120A may calculate the size of first dummy data and/or second dummy data necessary to encode the first partial data and/or the second partial data using the size information and/or the position information of the second (or first) partial data. In addition, before data read from the NVM device 140 is transmitted to the host 110, the flash manager 126 may transmit the data to the ECC engine 122 so that the data is decoded.

The ECC engine 122 includes an encoder 31, a data padding logic 32, and a decoder 33. When the flash manager 126 receives data from the host 110, the flash manager 126 transmits the data to the encoder 31 of the ECC engine 122. The encoder 31 generates an ECC parity for the data. At this time, according to the control of the flash manager 126, the data padding logic 32 pads the data, e.g., first partial data or second partial data, with first or second dummy data, thereby generating sector data having the same size as normal sector data.

The decoder 33 detects and corrects errors in data received from the flash manager 126 when the data is read. At this time, according to the control of the flash manager 126, the data padding logic 32 pads first or second partial data output from the NVM device 140 with first or second dummy data, thereby generating sector data having the same size as normal sector data.

Figure 11:
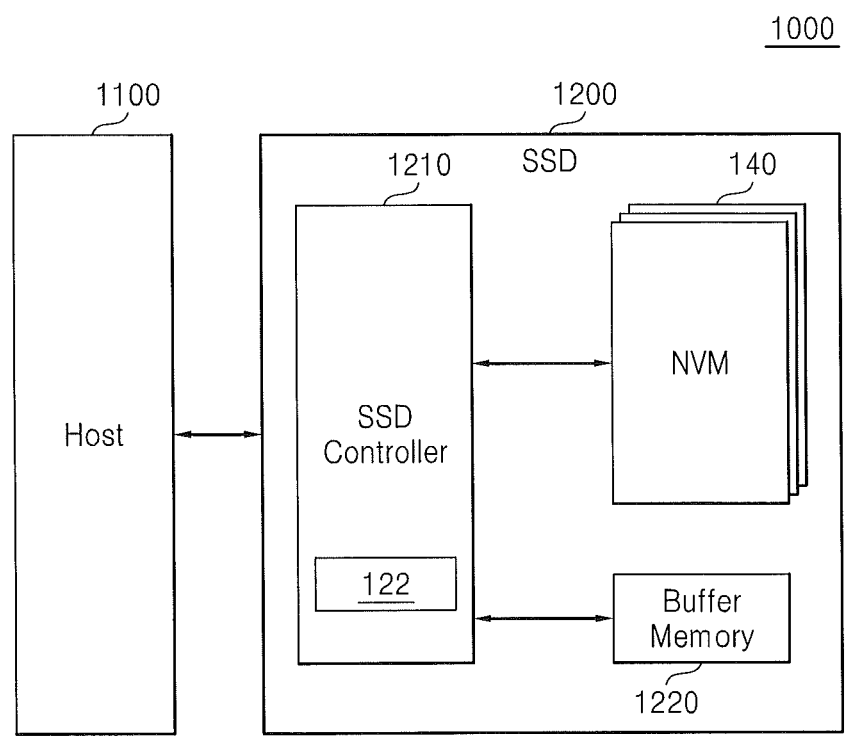
FIG. 11 is a block diagram of a memory system according to further embodiments of the inventive concepts.

FIG. 11 is a block diagram of a memory system 1000 according to further embodiments of the inventive concepts. The memory system 1000 may be a solid state drive (SSD) system. Referring to FIG. 11, the SSD system 1000 includes a host 1100 and an SSD 1200. The SSD 1200 includes an SSD controller 1210, a buffer memory 1220, and the NVM device 140. The SSD controller 1210 may include the ECC engine 122.

The SSD controller 1210 controls data communication between the host 1100 and the SSD 1200. In other words, the SSD controller 1210 provides interface corresponding to a bus format or protocol of the host 1100. In particular, the SSD controller 1210 decodes a command received from the host 1100. According to a result of the decoding, the SSD controller 1210 performs an access operation, e.g., a read operation, a program operation or an erase operation, on the NVM device 140.

The bus format of the host 1100 may be USB, small computer system interface (SCSI), peripheral component interconnect (PCI) express, advanced technology attachment (ATA), parallel ATA (PATA), serial ATA (SATA) and/or serial attached SCSI (SAS).

The buffer memory 1220 temporarily stores program data received from the host 1100 or data read from the NVM device 140. The buffer memory 1220 may be implemented by synchronous DRAM (SDRAM) in order to provide sufficient buffering for the SSD 1200 used as a large-capacity auxiliary memory device.

The NVM device 140 is provided as a storage medium for the SSD 1200. For instance, the NVM device 140 may be implemented by NAND flash memory having mass storage capacity. The NVM device 140 may include a plurality of memory devices. At this time, the memory devices may be connected with the SSD controller 1210 by channels.

It has been explained that the NVM device 140 is implemented by NAND flash memory, but the NVM device 140 may be implemented using phase-change RAM (PRAM), magnetic RAM (MRAM), resistive RAM (ReRAM), FRAM and/or Nor flash memory and may be implemented using different types of memory devices in the memory system 1000.

Figure 12:
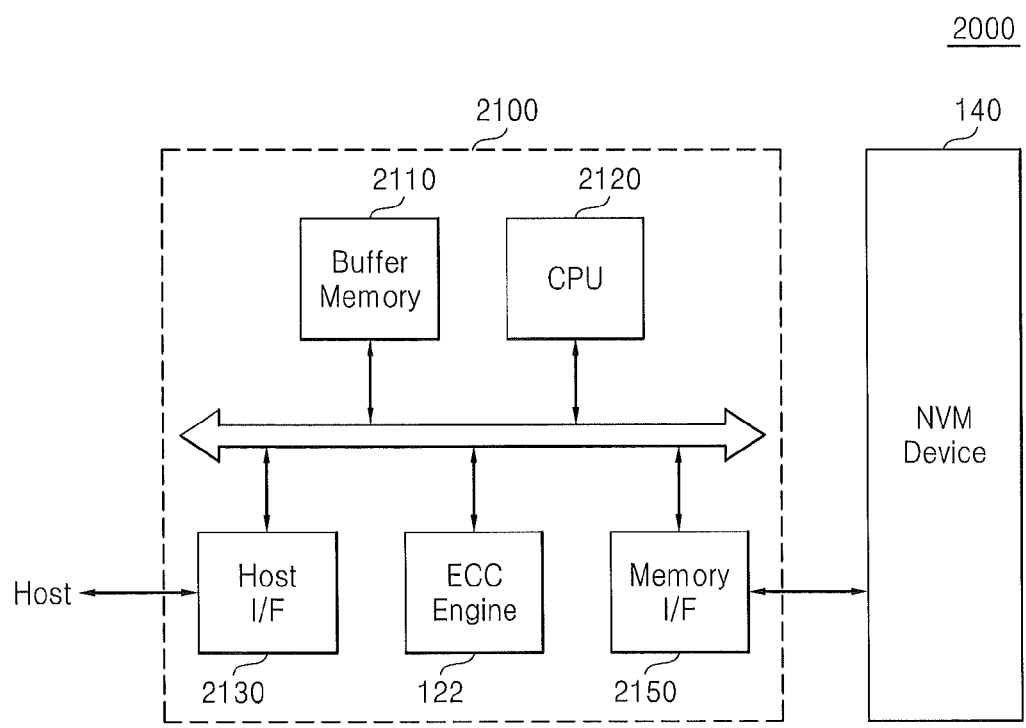
FIG. 12 is a block diagram of a memory system according to yet other embodiments of the inventive concepts.

FIG. 12 is a block diagram of a memory system 2000 according to yet other embodiments of the inventive concepts. Referring to FIG. 12, the memory system 2000 includes the NVM device 140 and a memory controller 2100.

The memory controller 2100 controls the NVM device 140. The memory system 2000 may be implemented as a PC, a laptop computer, a tablet PC, a memory card, a smart card, a cellular phone, a smart phone, a tablet PC and/or an SSD.

A buffer memory 2110 is used as an operation memory of a CPU 2120. A host interface 2130 may be implemented by a circuit, a logic, a code or a combination thereof and provides interface between the memory system 2000 and a host for data communication. The ECC engine 122 detects and corrects errors in data read from the NVM device 140.

A memory interface 2150 may be implemented by a circuit, a logic, a code or a combination thereof and provides interface between the NVM device 140 and the memory controller 2100. The CPU 2120 controls the overall operation of the memory controller 2100. The memory system 2000 may also include non-volatile memory, such as ROM, which stores code data for the interface with the host.

The NVM device 140 may be packed in a multi-chip package including a plurality of flash memory chips. The memory system 2000 may be provided as a storage medium with high reliability and low error rate. As described above, the memory system 2000 may be used as an SSD. In this case, the memory controller 2100 may communicate with an external device (e.g., a host) using one of various interface protocols such as a USB protocol, an SD card protocol, an MMC protocol, a PCI express protocol, a SAS protocol, a SATA protocol, a PATA protocol, an SCSI protocol, an enhanced small disk interface (ESDI) protocol, and/or an integrated drive electronics (IDE) protocol. In addition, the memory controller 2100 may also include a configuration for performing a random operation.

Figure 13:
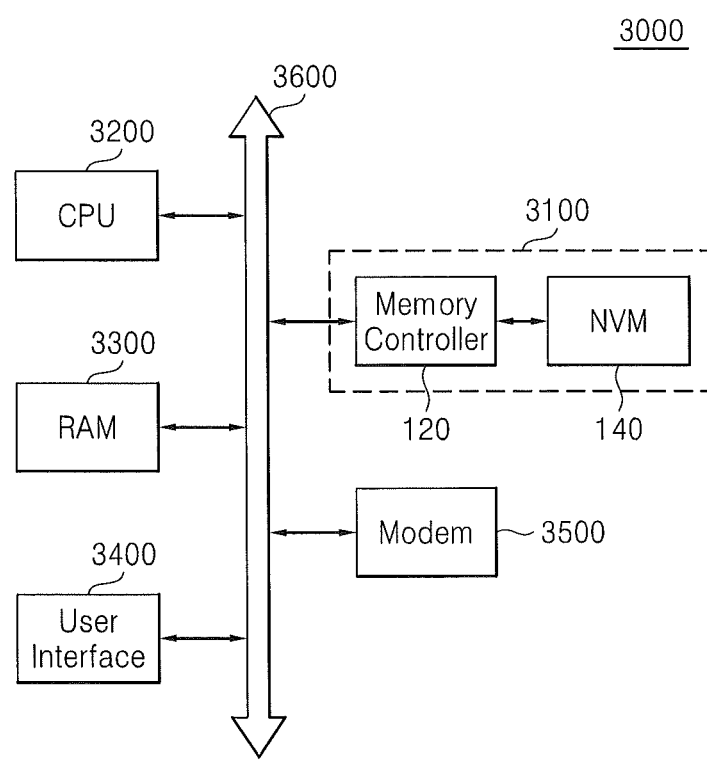
FIG. 13 is a block diagram of a computing system including a memory system according to some embodiments of the inventive concepts.

FIG. 13 is a block diagram of a computing system 3000 including a memory system 3100 according to some embodiments of the inventive concepts.

Referring to FIG. 13, the computing system 3000 includes a CPU (or a processor) 3200, a RAM 3300, a user interface 3400, a modem 3500 such as a baseband chipset, and the memory system 3100. The memory system 3100 includes the memory controller 120 and the NVM device 140.

The computing system 3000 may be implemented as a PC, a laptop computer, a cellular phone, a smart phone, a tablet PC, a server, a personal digital assistant (PDA), a portable multimedia player (PMP), a navigation system, and/or a game controller.

When the computing system 3000 is a mobile device, the computing system 3000 may also include a battery (not shown) supplying an operating voltage. The computing system 3000 may also include an application chipset, a camera image processor, and a mobile DRAM. The memory system 3100 may be implemented, for example, by an SSD including the NVM device 140 storing data and the memory controller 120 controlling the operation of the NVM device 140. The memory system 3100 may also include a fusion flash memory.

According to some embodiments of the present inventive concepts, a memory controller can program data smaller than sector data to a flash memory without the need for significant overhead. A data processing method of a memory controller according to some embodiments of the present inventive concept allows the memory controller to encode or decode each page. A memory system according to some embodiments of the present inventive concept can provide high-performance and high-efficiency operations regardless of the size of a sector using the data processing method.

Exemplary embodiments were described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by processor circuitry. These computer program instructions may be provided to processor circuitry of a general purpose computer circuit, special purpose computer circuit such as a memory controller, and/or other programmable data processor circuit to produce a machine, such that the instructions, which execute via the processor circuitry of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s). These computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/BlueRay).

The computer program instructions may also be loaded onto a computer and/or other programmable data processing apparatus such as a memory controller to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, embodiments of the present invention may be embodied in hardware and/or in software (including firmware, resident software, micro-code, etc.) that runs on a processor such as a memory controller, which may collectively be referred to as "processor circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Many different embodiments were disclosed herein, in connection with the following description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A data processing method of a memory controller, the data processing method comprising:
   receiving first partial data of last sector data among a plurality of sector data to be stored in an n-th page of a non-volatile memory in a program operation;
   padding the first partial data with first dummy data and generating a first error correction code (EEC) parity in the program operation;
   transferring the first partial data and the first ECC parity to the non-volatile memory, while refraining from transferring the first dummy data to the non-volatile memory, in the program operation;
   receiving second partial data, which is stored in an (n+1)-th page of the non-volatile memory, of the last sector data in the program operation, wherein the receiving the second partial data comprises receiving size information and/or position information of the first partial data, which are stored in a storage, together with the second partial data;
   padding the second partial data with second dummy data and generating a second ECC parity in the program operation;
   transferring the second partial data and the second ECC parity to the non-volatile memory, while refraining from transferring the second dummy data to the nonvolatile memory, in the program operation;
   storing the first partial data read in the read operation on the n-th page of the non-volatile memory in a buffer memory;
   reading the second partial data from the (n+1)-th page; and
   recovering the first partial data and the second partial data to the sector data and transferring the sector data to a host.

2. The method of claim 1, wherein a sum of a size of the first partial data and a size of the first dummy data is equal to a size of sector data of the non-volatile memory, and the first dummy data is data with no errors.

3. The method of claim 1, further comprising the storing size information of the first partial data and/or the position information of the first partial data in a storage.

4. The method of claim 1, further comprising:
receiving the first partial data and the first ECC parity from the non-volatile memory in a read operation;
padding the first partial data with the first dummy data and generating read data in the read operation; and
performing error correction on the read data using the first ECC parity in the read operation.

5. The method of claim 1, further comprising:
receiving the second partial data and the second ECC parity from the non-volatile memory in a read operation;
padding the second partial data with the second dummy data and generating read data in the read operation; and
performing error correction on the read data using the second ECC parity in the read operation.

6. A memory controller comprising:
a buffer manager configured to manage data including first partial data of at least one sector data;
an error correction code (ECC) engine configured to pad the first partial data with first dummy data and generate a first ECC parity; and
a flash manager configured to be connected between the buffer manager and the ECC engine and configured to transmit the first partial data and the first parity to a flash memory, while refraining from transmitting the first dummy data to the flash memory, according to a command of a host;
wherein the flash manager includes a storage configured to store size information of the first partial data and/or position information of the first partial data; and
wherein the ECC engine is configured to calculate a size of the first dummy data using the size information and/or the position information of the first partial data stored in the storage.

7. A memory controller comprising:
a buffer manager configured to manage data including first partial data of at least one sector data;
an error correction code (ECC) engine configured to pad the first partial data with first dummy data and generate a first ECC parity; and
a flash manager configured to be connected between the buffer manager and the ECC engine and configured to transmit the first partial data and the first parity to a flash memory, while refraining from transmitting the first dummy data to the flash memory, according to a command of a host;
wherein the buffer manager is configured to control a buffer memory to temporarily store second partial data of the sector data while the first partial data is programmed to an n-th page of the flash memory.

8. The memory controller of claim 7, wherein the buffer manager is configured to control the buffer memory to temporarily store the first partial data read from the n-th page of the flash memory while an (n+1)-th page of the flash memory comprising second partial data related with the first partial data is read.

9. The memory controller of claim 7, wherein when the flash manager is configured to read the first partial data and the first parity from the flash memory according to a command of the host, the ECC engine pads the first partial data with the first dummy data to generate read data and performs error correction on the read data using the first parity.

10. The memory controller of claim 7, wherein the ECC engine comprises:
a data padding logic configured to pad the first partial data with the first dummy data;
an encoder configured to generate the first ECC parity using the first partial data and the first dummy data; and
a decoder configured to perform error correction on the first partial data using the first parity.

11. A flash memory device which performs data input/output in units of sectors, the flash memory device comprising:
an n-th page which stores at least one partial data and at least one error correction code (ECC) parity for the at least one partial data, wherein the at least one partial data is smaller than each sector;
a memory controller configured to control the flash memory device, wherein when receiving first partial data of last sector data among a plurality of sector data to be stored in the n-th page of the flash memory device, the memory controller pads the first partial data with first dummy data, generates a first ECC parity, and transfers the first partial data and the first parity to the flash memory device, while refraining from transmitting the first dummy data to the flash memory device; and
a buffer memory configured to temporarily store second partial data of the last sector data while the first partial data is programmed to the flash memory device.

12. The device of claim 11, wherein the page is a basic unit of a program or read operation and stores a plurality of sector data.

13. The device of claim 11, further comprising a storage configured to store size information of the first partial data and/or position information of the first partial data.

* * * * *